(12) United States Patent
Cohen

(10) Patent No.: US 8,791,843 B2
(45) Date of Patent: Jul. 29, 2014

(54) OPTIMIZED BITSTREAM ENCODING FOR COMPRESSION

(71) Applicant: LSI Corporation, Milpitas, CA (US)

(72) Inventor: Earl T. Cohen, Oakland, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/651,627

(22) Filed: Oct. 15, 2012

(65) Prior Publication Data

US 2014/0104084 A1    Apr. 17, 2014

(51) Int. Cl.
*H03M 7/34* (2006.01)
*H03M 7/38* (2006.01)

(52) U.S. Cl.
USPC .............................................. 341/51; 341/87

(58) Field of Classification Search
USPC ................ 341/50, 51, 59, 67, 65, 87
See application file for complete search history.

(56) References Cited

U.S. PATENT DOCUMENTS

| | | | | |
|---|---|---|---|---|
| 4,988,998 A | | 1/1991 | O'Brien | 341/55 |
| 5,627,534 A | * | 5/1997 | Craft | 341/87 |
| 5,701,125 A | | 12/1997 | Berlin | 341/63 |
| 5,951,623 A | | 9/1999 | Reynar et al. | 708/203 |
| 6,411,227 B1 | * | 6/2002 | Fish | 341/65 |
| 6,903,668 B1 | * | 6/2005 | Dror et al. | 341/67 |
| 7,233,266 B2 | * | 6/2007 | Sasakura | 341/51 |
| 7,342,902 B2 | | 3/2008 | Garakani et al. | 370/329 |
| 7,358,867 B2 | * | 4/2008 | Fallon | 341/51 |
| RE41,152 E | | 2/2010 | Reynar et al. | 708/203 |
| 7,692,560 B2 | | 4/2010 | Garakani et al. | 341/51 |
| 8,044,829 B2 | * | 10/2011 | Chen et al. | 341/51 |
| 8,090,027 B2 | | 1/2012 | Schneider | 375/240.23 |
| 8,125,364 B2 | | 2/2012 | Torii | 341/151 |
| 8,179,291 B2 | * | 5/2012 | Shalev et al. | 341/51 |
| 8,243,340 B2 | | 8/2012 | McDowell et al. | 358/426.13 |

* cited by examiner

*Primary Examiner* — Peguy Jean Pierre
(74) *Attorney, Agent, or Firm* — Christopher P. Maiorana, PC

(57) ABSTRACT

An apparatus includes a first circuit and a second circuit. The first circuit may be configured to generate (i) a compressed representation of an input sequence of characters and (ii) statistics regarding one or more types of information in the compressed representation of the input sequence of characters. The second circuit may be configured to generate a compressed bitstream representation of the input sequence of characters in response to the compressed representation of the input sequence of characters and one or more of the statistics regarding the one or more types of information in the compressed representation of the input sequence of characters. The bitstream values encoding the one or more types of information are generally determined based upon a frequency of occurrence of the one or more types of information in the compressed representation of the input sequence of characters.

15 Claims, 9 Drawing Sheets

OPTIMIZED BITSTREAM ENCODING FOR COMPRESSION

FIELD OF THE INVENTION

The present invention relates to data storage generally and, more particularly, to a method and/or apparatus for implementing optimized bitstream encoding for compression.

BACKGROUND OF THE INVENTION

Compression techniques, such as some variations of Lempel-Ziv (LZ), reduce an input string into a self-referencing "dictionary" where a second occurrence of a string of characters is replaced by a copy command referencing a prior occurrence of the string as a number of characters (i.e., a length) at a certain offset prior to a current position. For example, the string "bcdezbcde" could be compressed to the string "bcdez" followed by a command to copy a length of 4 characters starting at an offset 5 characters previous to the current position (i.e., "Copy(4,5)"). If the "Copy(4,5)" instruction takes fewer bits to output than the corresponding string of characters, the output is more compressed than the input.

The result of compression is sometimes called a "bitstream" because there are no fixed character boundaries in the result, and the quantities encoded in the bitstream are often variable in size. Generating a bitstream can be done as one or more passes. For example, a first pass can create a hash table indicating all occurrences of three-character or four-character strings in the input string. The hash table allows matches to be found more quickly. A second (compression) pass uses the hash table to find the best "matches" earlier in the input string for any repeated sub-strings. Based on the matches, some of the characters (i.e., repeats of earlier sub-strings) are replaced with copy instructions, creating the self-referencing dictionary. A third pass then turns the remaining characters and the copy instructions into an output bitstream. In between the second and third passes, statistics are used to determine how to best generate the output bitstream (generally, best means with the fewest bits). For example, the set of characters used in the input can be compressed in a number of ways. Knowledge of the distribution of lengths and offsets in the copy instructions can be used to compress those values.

While the compression of characters themselves can be done easily and efficiently (such as using tables based on known statistical occurrences of characters), the efficient compression of the lengths and offsets also needs to be done efficiently. Table-based approaches are very data-specific and do not produce good results across a wide range of data patterns. Even the conventional approach of using multiple tables and selecting the best result can be sub-optimal.

It would be desirable to implement optimized bitstream encoding for compression.

SUMMARY OF THE INVENTION

The present invention concerns an apparatus including a first circuit and a second circuit. The first circuit may be configured to generate (i) a compressed representation of an input sequence of characters and (ii) statistics regarding one or more types of information in the compressed representation of the input sequence of characters. The second circuit may be configured to generate a compressed bitstream representation of the input sequence of characters in response to the compressed representation of the input sequence of characters and one or more of the statistics regarding the one or more types of information in the compressed representation of the input sequence of characters. The bitstream values encoding the one or more types of information are generally determined based upon a frequency of occurrence of the one or more types of information in the compressed representation of the input sequence of characters.

The objects, features and advantages of the present invention include providing a method and/or apparatus for implementing optimized bitstream encoding for compression that may (i) provide hardware-implementable encoding of numeric values (e.g., lengths, offsets, and flags) used in compression techniques, (ii) provide an efficient implementation for generating a near-optimal encoding in a very short time and with low latency, (iii) provide a scheme that is much less data dependent than other schemes, (iv) perform as well or better than other techniques specifically tailored for certain data patterns, (v) provide a generic scheme such that the same hardware engine may be instantiated for different types of numeric values (e.g., lengths, offsets, flags, etc.), and/or (vi) be implemented in software, in hardware, or in a combination of hardware and software.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Compression is not a "one size fits all" problem. Compression techniques that work well with one data set tend to work poorly with others. Embodiments in accordance with the present invention generally provide a relatively generic, hardware (H/W) implementable scheme for bitstream encoding data patterns including, but not limited to lengths, and offsets that are frequently used in certain compression techniques such as Lempel-Ziv (LZ). A related issue is "flag" encoding. In some types of LZ compression (e.g., LZ77), copy instructions need to be distinguished from the characters themselves in the output bitstream. One way to distinguish the copy instructions is to have a "flag" followed by a count of the number of characters (from 0 to n) prior to the next copy instruction. For example, the sequence "bcdez" followed by the command "Copy(4,5)" may be fully encoded as:

Flag(5) bcdez Copy(4,5)

The flag value (the character count) also needs to be encoded efficiently. There are a number of ways of encoding flags. In one example, flags may be encoded as one bit per output "symbol" indicating whether the symbol is a character or a copy instruction. Character-count encoding of flags, however, is one technique that is advantageous in many circumstances.

Figure 1:
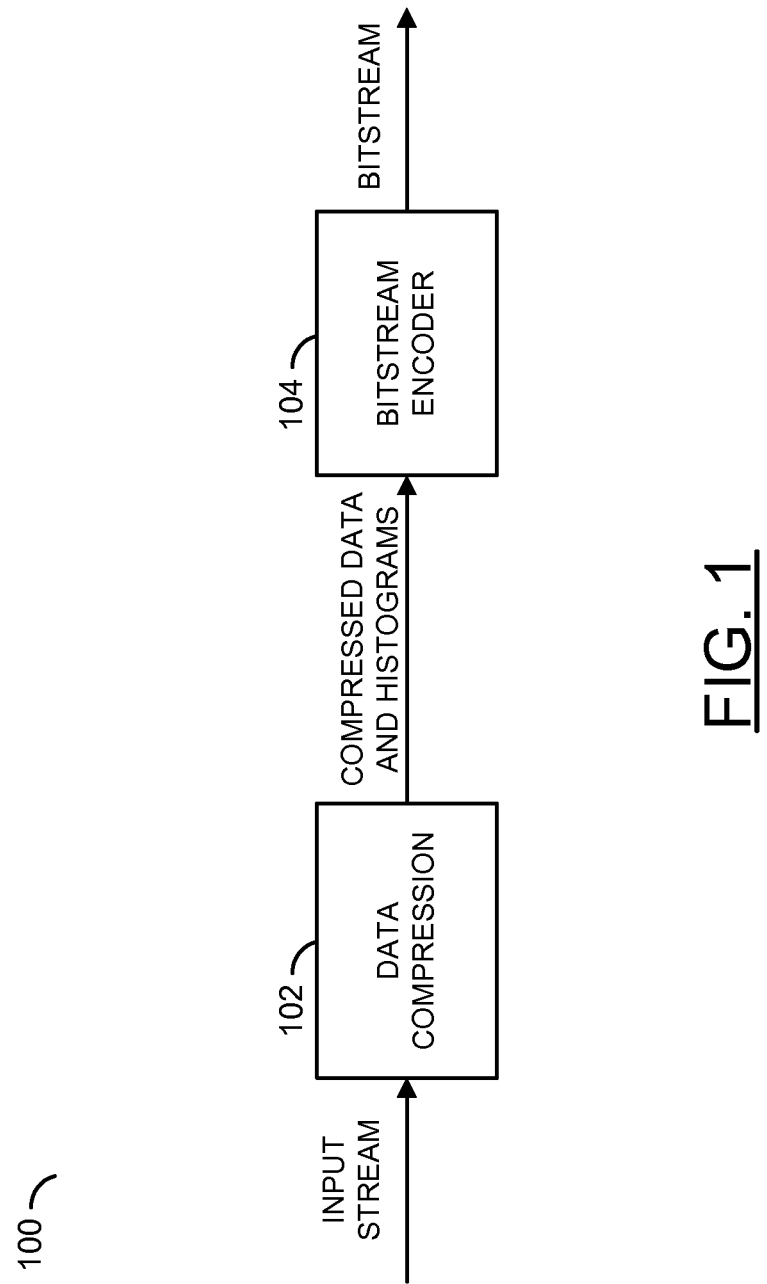
FIG. 1 is a diagram illustrating a data compression unit in accordance with an embodiment of the present invention.

Referring to FIG. 1, a diagram of a circuit 100 is shown illustrating a compression unit in accordance with an embodiment of the present invention. In one example, the circuit 100 may comprise a block (or circuit) 102 and a block (or circuit) 104. The block 102 may implement a data compression module in accordance with an embodiment of the present invention. The block 104 may implement a bitstream encoder module in accordance with an embodiment of the present invention. In some embodiments, the block 102 has an input that receives a signal (e.g., INPUT STREAM) and an output that presents a signal (e.g., COMPRESSED DATA AND HISTOGRAMS). The signal INPUT STREAM may comprise blocks, sequences, or other data structures. The signal COMPRESSED DATA AND HISTOGRAMS comprises a compressed representation of the signal INPUT STREAM and statistics about the compression. In one example, the statistics comprise information (e.g., frequency of occurrence, etc.) regarding one or more types of information in the compressed representation of the signal INPUT STREAM. In one example, the block 102 may be configured to perform a compression operation that transforms runs in the signal INPUT STREAM into a more compact form prior to a search operation that is part of a compression routine. In one example, the block 102 may perform Lempel-Ziv (e.g., LZ77) compression. In another example, the block 102 may perform a modified Lempel-Ziv encoding technique described in co-pending U.S. patent application Ser. No. 13/651,655, filed Oct. 15, 2012, which is herein incorporated by reference.

In some embodiments, the block 104 has an input that receives the signal COMPRESSED DATA AND HISTOGRAMS and an output that presents a signal (e.g., BITSTREAM). The block 104 may be configured to utilize the statistics information generated by the block 102 to adjust (e.g., optimize) bitstream encoding operations.

Figure 2:
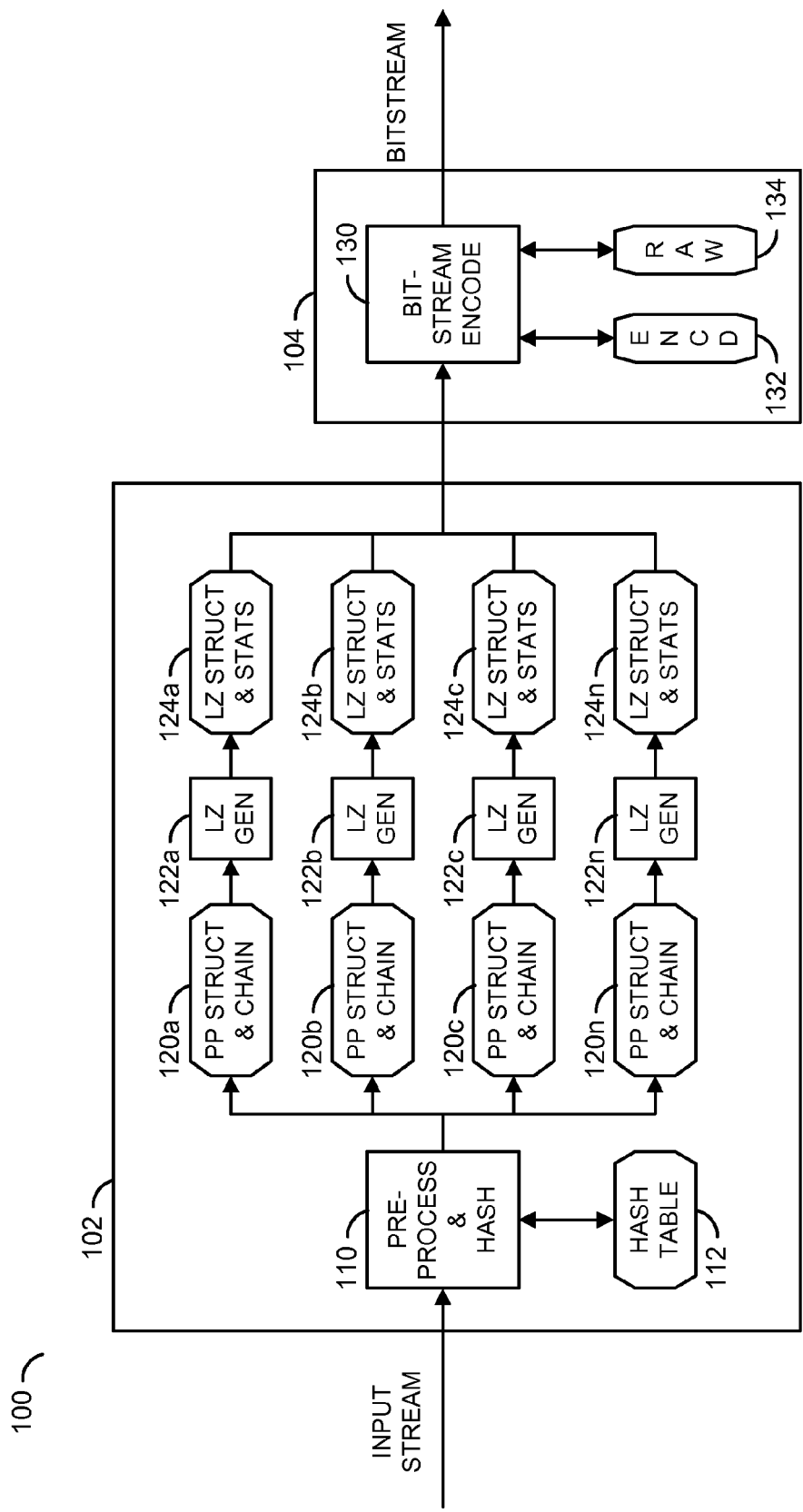
FIG. 2 is a diagram illustrating an example implementation of a compression module and a bitstream encoder of FIG. 1.

Referring to FIG. 2, a diagram is shown illustrating an example implementation of a compression module and a bitstream encoder module of FIG. 1. In one example, an overall hardware (H/W) structure may comprise stages of processing and data structures. The data structures may be stored in buffers. The buffers may be implemented, for example, in random access memory (RAM). However, other storage media may be implemented to meet the design criteria of a particular application. In one example, the block 102 may be implemented comprising a pre-processing and hash processing stage 110, a hash table data structure 112, a number of PP structures and chains 120a-120n, a number of LZ compression engines 122a-122n, and a number of LZ output data structures and statistics 124a-124n. The particular number n of PP structures and chains, LZ compression engines, and LZ output data structures and statistics implemented generally depends on the desired throughput. The output of the block 102 may be presented to the input of block 104.

In some embodiments, the block 104 comprises a block (or circuit 130), a block (or circuit 132), and a block (or circuit) 134. The block 130 may implement a bitstream encoding technique in accordance with an embodiment of the present invention. The block 132 may implement a buffer for storing encoded data. The block 134 may implement a buffer for storing original data. In one example, the block 130 may be configured to use the LZ generated statistics to determine the best (e.g., fewest bits) encoding format, and then processes the LZ structures 124a-124n to produce an encoded output form. The encoded output may be stored in the buffer 132 and the original (or raw) input may be stored in the buffer 134. The bitstream encoding implemented by the block 130 may operate store-and-forward using ping-pang buffering as the block 130 determines whether the encoded output is good enough, or if the original input should be used instead. For example, the original input may be used when the compression achieved is insufficient. While in some embodiments the pre-processing and hashing block 110 and the bitstream encoding block 104 may be implemented as common logic (e.g., used by all the compression engines 122a-122n), in other embodiments multiple pre-processing and hashing blocks and/or multiple bitstream encoding blocks may be implemented relative to the compression engines, including static or dynamic assignment in any combination.

The block 110 is generally configured to pre-process the input character stream of each input frame and process runs, producing the PP structures 120a-120n with one entry per literal and three entries per run of three or more characters. The term literal refers to a character that is a copy of the corresponding character from the input stream. Similarly the term literals refers to one or more characters that are a copy of the corresponding one or more characters from the input stream. Runs of three or more characters are encoded, and include all characters possible. In parallel, a random access memory 112 holding a large Hash Table is used to build the Hash Chains for the input frame.

The output of the pre-processing module 110 is written alternately into the number of buffers 120a-120n so that each of the number of LZ engines 122a-122n has a longer period to operate on each input frame. For example, in an embodiment where n=4, four buffers 120a-120d, four LZ engines 122a-122d, and four buffers 124a-124d may be implemented, giving the LZ engines 122a-122d four times as long to operate on each input frame. The LZ engines 122a-122n each process (on average) one byte per cycle. Thus, when running, for example, at 400 MHz, each has a throughput of 400 MBps. The LZ engines 122a-122n generally produce an LZ structure containing copy commands and literals, plus statistics on different encoding methods for literal, length, offset, and flag values. The LZ structures produced by each LZ engine 122a-122n are generally stored in the respective data buffers 124a-124n. In order to provide a predetermined throughput, a particular LZ engine may run out of time and have to stop compressing. Time may be shared among engines, though, since average (not worst-case) throughput is what matters. The LZ structure and/or buffer 134 includes a copy of the raw input in case compression fails. Compression failure may not be known until after bitstream encoding.

Compression is generally performed as one or more passes. For example, a first pass may use a hash (and a hash table) to create a chain (pointer) table indicating all occurrences of three-character or four-character strings in the input stream. The chain table generally allows matches to be found more quickly. A second pass (e.g., the compression processing pass) may use the chain table to find the best "matches" earlier in the input stream for any repeated sub-strings. The characters of repeated sub-strings may be replaced with copy instructions, creating the self-referencing dictionary. A third pass then turns the remaining characters and the copy instructions into an output bitstream. In between the second and third passes, statistics are generally used to determine how to best generate the output bitstream (generally, best means with the fewest bits). For example, the set of characters used in the input may be compressed in a number of ways. Knowledge of the distribution of lengths and offsets in the copy instructions may be used to compress those values.

In some embodiments, a "squishing" step to reduce repeated runs of characters to a more compact representation may be added as part of the hashing step and extra passes over the data may be omitted, reducing latency. Adding squishing as part of or prior to hashing also reduces the number of hashes that are performed, saving time in that part of the process. In other embodiments, squishing may be done as a separate pass either before or after hashing. In still further embodiments, squishing may be done as a first part of the compression pass and runs may be "squished" just prior to being considered by the compression engine.

Figure 3:
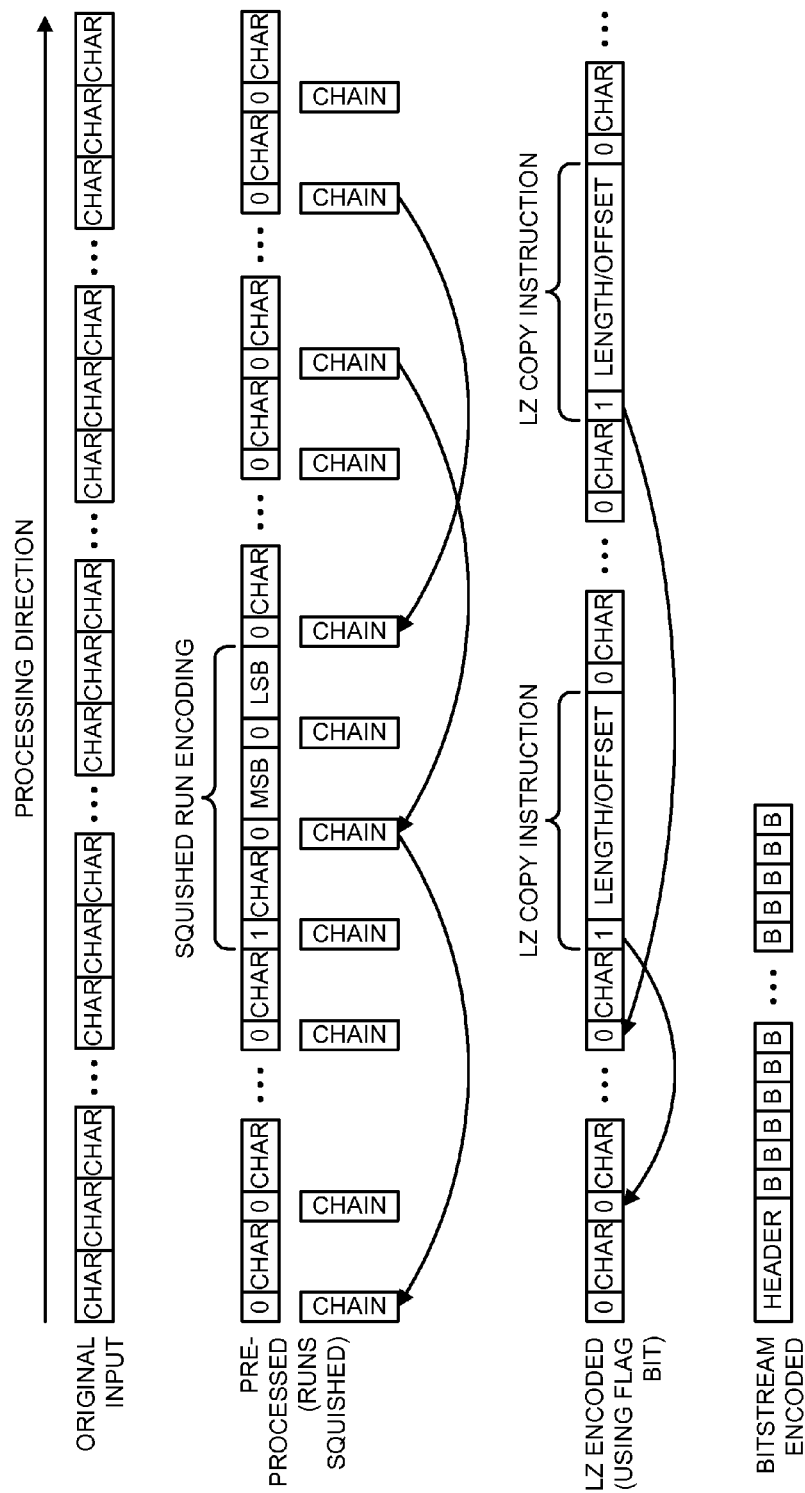
FIG. 3 is a diagram illustrating an bitstream encoding process in accordance with an embodiment of the present invention.

Referring to FIG. 3, a diagram is shown illustrating an example of an overall processing flow, where each entry in the squished stream is shown as having a corresponding chain pointer produced by the hashing and indicating locations of previous possibly-matching sub-strings if any. Squishing results in a reduced input stream. In some embodiments, the input stream is not actually reduced, but holes are left in the input stream that may be skipped by the compression engine.

Subsequent to squishing, the runs need to be represented in the resulting stream. Representing the runs can be done in a number of ways. For example, the pre-processed version of the signal INPUT STREAM may have one bit added per symbol (e.g., either a character or a run indication) indicating whether the symbol represents a literal or is related to a run. Alternatively, since each active (non-squished) position has a corresponding chain pointer (produced by the hashing step), information may be added in the chain table indicating a run at that position. However, other representations may be implemented accordingly to meet the design criteria of a particular implementation.

When runs are squished, additional information is encoded with each run. For example, an encoded run may include the length of the run, or location to or an offset to the last character in the run, or other equivalent information. In some embodiments, as illustrated in FIG. 3, runs are at least three characters (e.g., a character repeated twice is generally not treated as a run). A run is generally represented in three characters using a flag bit to indicate that the symbol is a run, one character to provide the repeated character itself, and two characters to encode the length of the run. In various embodiments, encoding the length of the run in the pre-processed stream itself enables more efficient matching of runs during the compression engine processing. In other embodiments, run length may be limited to have a smaller squished encoding for runs, and a run longer than that representable may be represented as a sequence of two or more runs. Each position in the corresponding squished input stream has a corresponding chain pointer created by the hashing. The chain pointer points to possible earlier matching locations in the input stream. For example, with three-character hashing, the pointer for a current input stream position starting with "abc" would point to the closest prior location of a previous "abc" sequence (if any), and the pointer for that previous location would point to a further closest prior location of a previous "abc" sequence (if any), etc. Searching uses the chain pointers to enable searching only when there are possible, earlier matches. In other words, only non-NULL chain pointers need be followed. It is of particular note that without squishing of runs, each character in a run (after enough initial characters to cover the length of hashing) has a non-NULL chain pointer pointing to an earlier position in the run.

Three-character hashing is used in some embodiments since a copy instruction for a previous three-character sequence generally saves some space (whereas a copy instruction for a previous two-character sequence often does not). Other embodiments hash on other lengths, or on a combination of lengths (such as both three and four characters).

Figure 4:
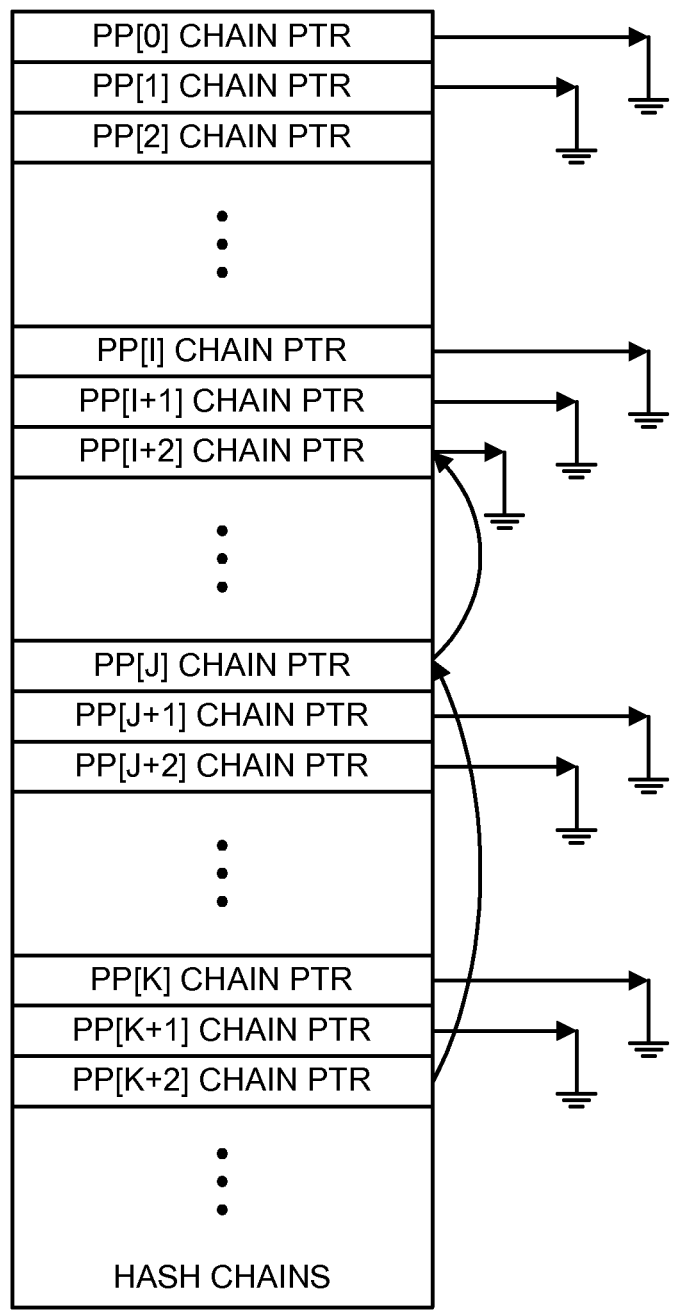
FIG. 4 is a diagram illustrating an example of a hash chain table.

Referring to FIG. 4, a diagram is shown illustrating another conceptual view of the chain table. Using a large (e.g., 16 KB, 32 KB, etc.) hash table, hash each successive triplet of characters in the PP structure. The hash is associated with the first character of a triplet. For example, the hash for the triplet composed of the characters at position i, i+1, and i+2 is associated with index i. A run will be hashed three times (regardless of length) as it takes up three indices in the PP structure. The run "aa . . . aabc" will be hashed as "aaa", "aab", and "abc", and each of these hashes is associated with the starting index of the respective triplet. In one example, all runs may take three entries in the PP structure. As each triplet is hashed, the hash value is looked up in the hash table (e.g., the hash value is an index into the hash table). On a miss, the chain pointer for that index is set to NULL, and the index is stored at the hash location in the hash table. On a hit, the chain pointer for that index is set to the old value found in the hash table at that location (e.g, the previous index that hashed to the same value), and the index is stored at the hash location in the hash table.

In this fashion, the chain pointers become a linked list (in order from locations closer to the end towards the start) of indices that hashed to the same location in the hash table. Once the chain structure is created, the hash table is not needed for further processing of the input frame, because the chain structure has all the necessary information as to which indices hash the same as which other indices. In general, the hash chains should be stored four or eight per row so that multiple pointers may be examined in parallel. LZ processing can thus easily handle multiple null pointers per cycle (e.g., just generating the corresponding number of literal copies).

With squishing and with n-character hashing, any run greater than or equal to n characters in length will need n separate chain table entries. Consider, for example, the character sequence "abcdexxxxxfghij" with three-character hashing. No matter how the five-character run "xxxxx" is squished, there are three hashes that need to be tracked as part of this run: e.g., "xxx," "xxf," and "xfg." Thus in terms of at least the chain table, a squished run cannot be represented in fewer than n character positions (with n-character hashing).

Figure 5:
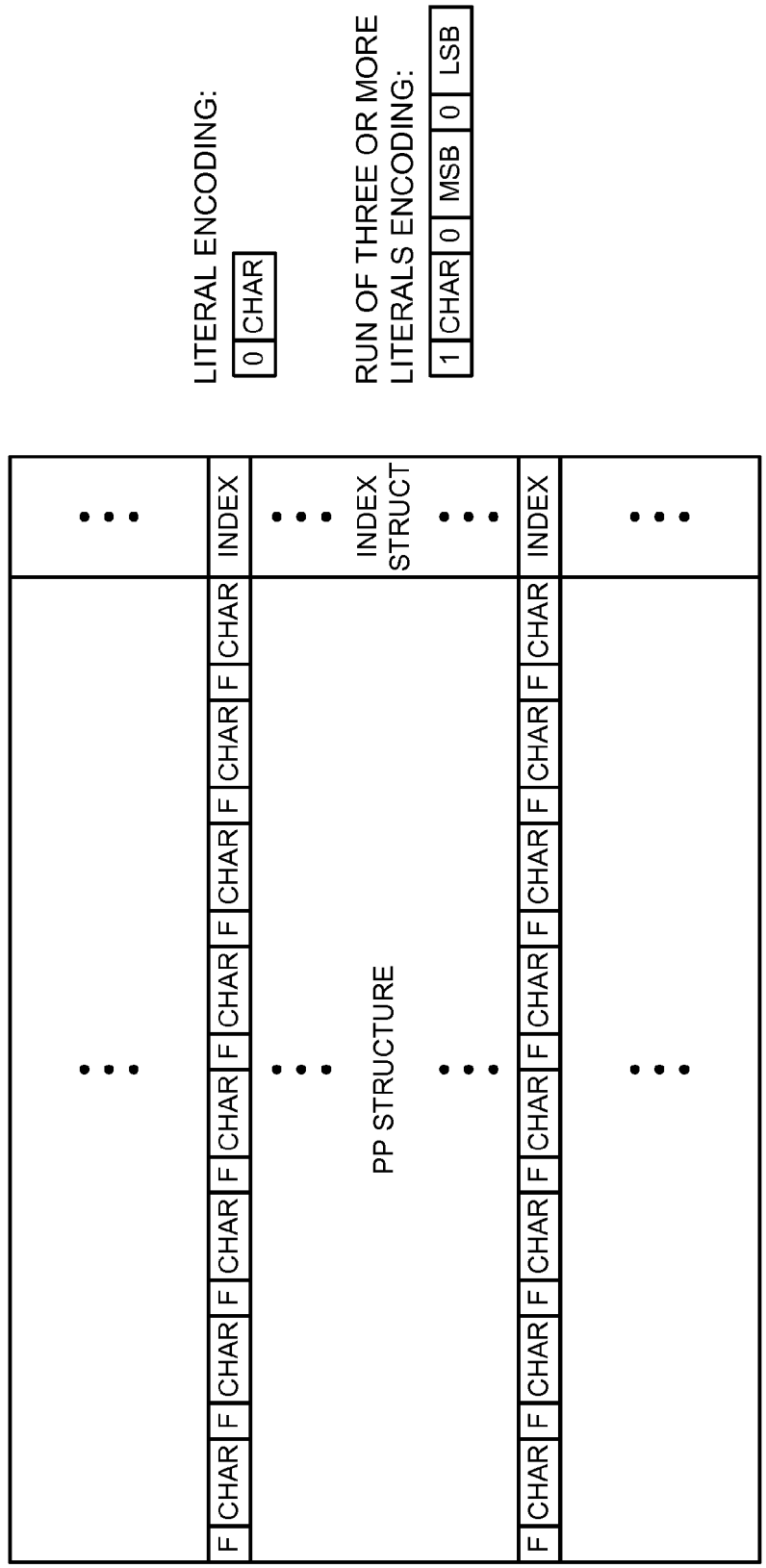
FIG. 5 is a diagram illustrating an array storing a side table.

Referring to FIG. 5, a diagram is shown illustrating an example of a side table in accordance with an embodiment of the present invention. If the squished (pre-processed, or "PP") stream is reduced in size, then each position in the squished stream must also track, such as in a side table, the index of that position in the original stream, as this information is needed to compute the proper offsets for copy instructions. One approach to such a side table is shown in FIG. 5, where a group of reduced characters (e.g., eight or sixteen reduced characters) share a single "index" location in the original input stream. The index of any specific reduced character within a group of eight may be found by counting within the group, including counting the length of any runs prior to the specific reduced character, and using that as an offset to the shared index.

In the compression processing, a search is made from a current position forward to find the first, non-NULL chain pointer after the current position. The non-NULL chain pointer indicates a possible prior match. The match is only possible (not guaranteed) since the non-NULL chain pointer is not a guarantee that even the first three characters match, it is just a guarantee that the first three characters hashed the same. Of course, if the initial hash was perfect, the non-NULL chain pointer could be a perfect guarantee, but that implies either a very large or a fully associative hash table was used, neither of which is particularly practical for a H/W implementation. If there was no match (or no acceptable match, such as a match longer than a specified minimum length), searching for the next non-NULL chain pointer continues, starting after the current position (e.g., the character at the current position is output from the compression engine as is, and the current position is advanced by one). If a match of a given length, x, is found, x characters starting at the current position are replaced by a copy instruction (e.g., referencing the match), and the current position is advanced by x characters (e.g., to the first character after the match) where searching for the next non-NULL chain pointer continues.

When a match is indicated (e.g., by the non-NULL chain pointer), a matching phase compares characters starting at the current position with characters at the position indicated by the non-NULL chain pointer. A length of matching characters is accumulated up until a non-matching character is found. If the chain pointer at the position indicated by the non-NULL chain pointer is also non-NULL, matching can be repeated further back in the input stream to see if a longer match can be found. The longest match found, if greater than a minimum length, is chosen and the characters at the current position are replaced by a copy instruction referencing the earlier occurrence of the same string (e.g., at a determined offset in the original input from the current location, and for the matched length). The number of chain table searches that can be done is limited, in some embodiments, to bound the overall compression processing time and achieve a desired throughput.

Squishing of runs modifies the compression processing in one or more ways. Input to the compression processing comprises not just single characters, but also a representation of squished runs, and the compression processing needs to handle these two types of "symbols." The compression pass is enabled to process a squished run as a unit (one symbol), both during the search for the next non-NULL chain pointer, and during the matching phase.

Using three-character hashing, any run of three or more characters has only three unique hash possibilities, independent of the length of the run. For example, in the sequence 'abcxxxxxdef', only three hashes starting in or after the run are unique: 'xxx' in the first and any middle positions, 'xxd' in the next-to-last position, and 'xde' in the last position. ('bcx' and 'cxx' are treated as the hashes of strings starting in those positions and are not part of the run.) Thus, searching for the next non-NULL chain pointer need only look at three possible chain pointers for any run of three characters or more, regardless of the length of the run. This improves the time to find the next non-NULL chain pointer. In embodiments where the input stream is reduced to produce the squished stream, there are no "holes" and time is saved without further complexity. In embodiments where the squished stream has "holes" during portions of a run that may be skipped, extra logic is optionally used to advance over a run to more quickly find the next non-NULL chain pointer.

When creating the chain pointers for a run, the three relevant positions (e.g., 'xxx', 'xxd', and 'xde' in the above example) are handled as follows. All characters at the start or middle of a run are treated as a single position. The chain pointer for the 'xxd' position would point to the closest previous occurrence of 'xxd' which might have been at the tail part of a run, or might have been just two 'x' characters without a third (e.g., 'axxd'). The chain pointer for 'xde' may be handled similarly.

During the matching phase, a squished run is also compared as a unit, rather than as individual characters, greatly speeding up matching. During the matching phase, special rules are needed when matches start or end with squished runs. Consider first the case where a run occurs in the middle of a match (and possibly ends the match). Using the encoding described above in connection with FIG. 3 (e.g., the initial character followed by the run length replaces the run), there are two choices: 1) the run is an exact match in character value and length, and matching works as for any other string of three characters (e.g., the initial character, the MSB of the length, and the LSB of the length all match), and matching continues with the character following the run; 2) the run is not an exact match, and the run at the current position is either shorter or longer than the run at the position being matched. In the second case, the matching clearly ends (e.g., part of the comparison, such as of the LSB, fails), and the length of match is increased by the shorter of the run at the current position or the run at the matching position. The matching phase would then optionally continue with a previous non-NULL chain pointer.

This leaves the case where the current position is one of the three positions we consider as part of the run (e.g., 'xxx', 'xxd', and 'xde' in the above example). There are sixteen cases to consider: whether the current position is not part of a run, or is the first, next-to-last, or last position of a run, crossed with whether the matching position (pointed to by a chain pointer from the current position, or followed from a chain pointer from the previous matching position) is not part of a run, or is the first, next-to-last, or last position of a run. The actions may be summarized in the following TABLE 1:

TABLE 1

| Current Position is/ Matching Position is | Not in a run | First in a run | Next-to-Last in a run | Last in a run |
| --- | --- | --- | --- | --- |
| Not in a run | normal | no match | smear | smear |
| First in a run | no match | smear* | no match | no match |
| Next-to-Last in a run | smear | no match | smear | no match |
| Last in a run | smear | no match | no match | smear |

In some embodiments, to make matching work as similarly as possible even in the presence of squished runs, a run at the current position and any run at the initial matching position (pointed to by a chain pointer) are "smeared" so that the encoded length is replaced by the first character of the run. For example, for purposes of character comparison, any run will look like a three-character sequence of one repeated character. In further embodiments, the smearing is done whether the current position is the first, next-to-last, or last of a run, and similarly and separately for the initial matching position. With smearing, a sequence such as 'xxdef' at the current position would transparently match with the tail of a run such as 'xxxxxdef' starting at the next-to-last position, even though the run is encoded as a single 'x' followed by a length of 0 (MSB) and 5 (LSB), because for matching purposes the 'x' is "smeared" and the encoded length ignored in these initial-run cases. In general, the first position of a run can only match the first position of another run, because by definition all runs are encoded and are at least three characters.

The smearing handles matching, and length computation works as normal in the non-first-position cases. In the first-position (two runs) case ("smear*" in TABLE 1 above), the following additions are needed:

The initial match length is the shorter of the two runs.

The offset of the match is the initial match length back from the end of the matching run (e.g., the two runs being justified at their ending, rather than starting, positions). This produces the shortest offset, which improves compression. (Offsets are computed using the position the character had in the input stream.)

The matching ends (for this matching position) if the run at the current position is longer. If the run at the current position is shorter, then matching can continue, assuming the two runs are justified at their ending positions. (E.g., the current position starts with 'xxxde' and the matching position starts with 'xxxxxxxxxde'—the runs match with a length of 3 and matching can continue after the runs).

In some embodiments, matching with runs may be optimized using other techniques. For example, if the reduced stream has not removed the positions in the middle of the run, matching may proceed as in an unmodified compression engine. Or, in other embodiments, matching may use information on the run length to quickly determine if the match ends (e.g., run lengths differ), or if not that the match should continue after skipping over the run.

When completing the matching phase where the current position is the first position of a run, it is possible that all prior matching runs were shorter than the current run, or that an offset to the best prior matching run is too long. In this case, the best compression result is obtained by outputting the run itself in a self-referencing fashion: one copy of the repeated character, followed by a copy instruction with an offset referencing the copy of the repeated character and a length equal to one less than the total length of the run. In some embodiments, runs are converted to copy instructions as part of the compression pass. In other embodiments, the compression pass leaves any unmatched encoded runs in the output of the compression pass, and bitstream encoding converts any leftover runs into self-referencing copy instructions.

Extensions to multi-character runs are also contemplated. Consider two-character runs, for example "ababab" or "ababab". One difference is that the repetition can end in either one of the two characters. In some embodiments, two-character repetitions are always stored in a canonical order (such as the smaller one of the two character first), along with the length of the repetition in total characters and two extra bits encoding whether the starting character of the repetition is the smallest (first-encoded) character or the larger (second-encoded) character. For example, both "babab" and "ababab" would be stored as "ab" followed by encoding for the length and the two extra bits. One advantage of storing in canonical order is that both a "baba . . . " repetition and a "abab . . . " repetition have a chain pointer in the first position corresponding to "aba". For three-character hashing, chain pointers for the next to-last and last positions will be different for each occurrence regardless of starting order due to differences in the characters after the repetition. For initial repetitions, the matching logic needs to adjust the offset and/or the length based on how the current and matching positions end. Similar adjustments need to be made if a match ends at a repetition (and whether the two repetitions start with the same character or not).

Figure 6:
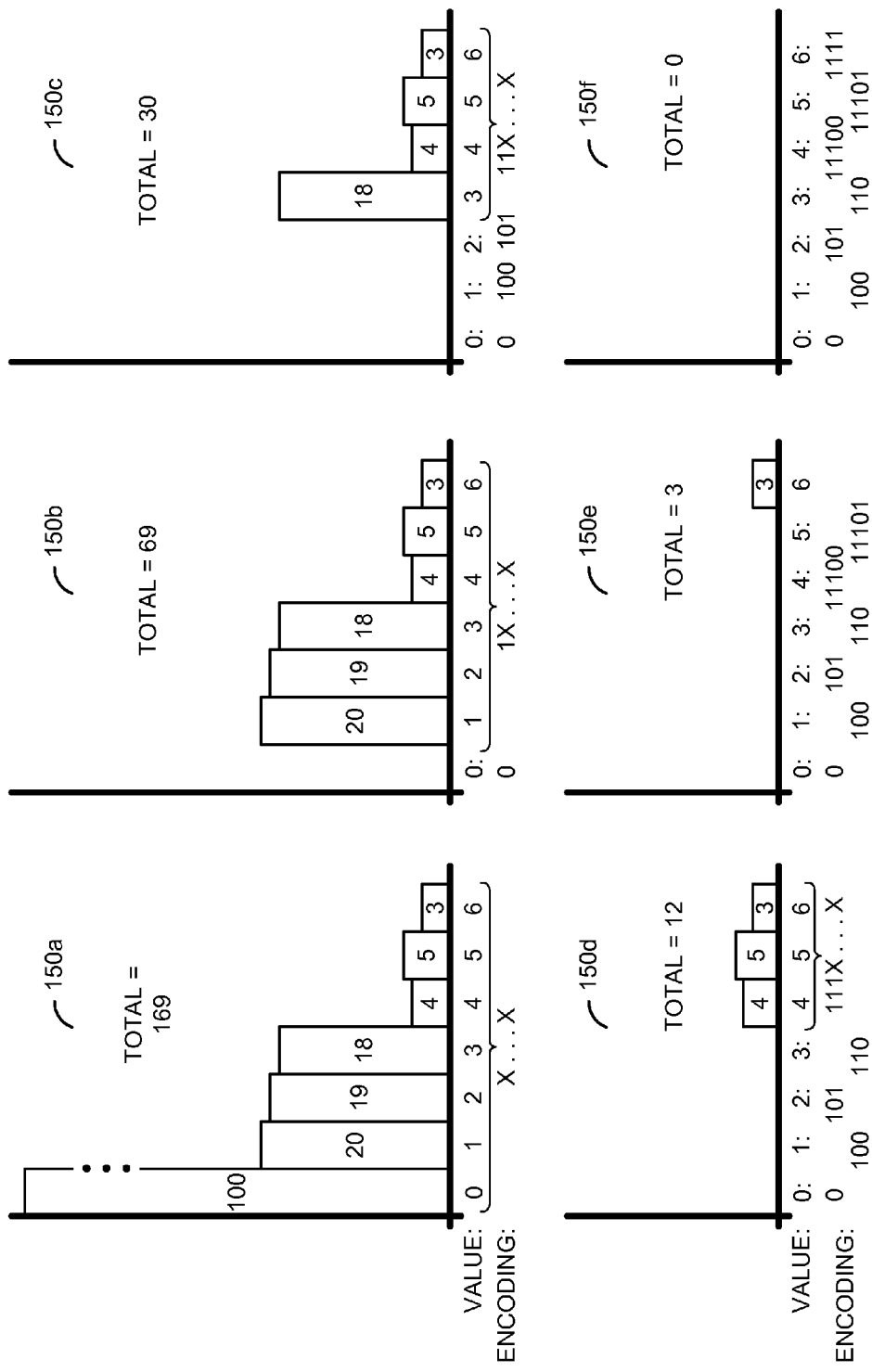
FIG. 6 is a diagram illustrating an example encoding scheme based on histograms produced by the data compression module in FIG. 1.

Referring to FIG. 6, a diagram is shown illustrating a number of histograms 150a-150f. The statistics output produced by the data compression module 102 in FIGS. 1 and 2 generally includes the histograms and/or a representation of the histograms. The histograms 150a-150f generally illustrate application of an encoding process in accordance with an embodiment of the present invention. During a compression pass over an input character stream where a self-referencing dictionary is created, histograms may be maintained for one or more of lengths, offsets, and flags. The histograms count occurrences of a given value. For example, a histogram may be implemented counting a number of flags having values 0, 1, 2, . . . up to some maximum. The histograms may be described as having "buckets" (or "bins") containing the counts of flags having a certain value. For example, the bucket in position 0 of the histogram has a count of how many flags had the value 0, the bucket in position 1 of the histogram has a count of how many flags had the value 1, etc.

In some embodiments, when given a histogram of the values of interest (where buckets in the histogram provide a count of how many times each value occurs), a quick post-processing step is enabled to produce a near-optimal encoding of the values (e.g., the flag values, or, via respective histograms, the length values or the offset values). Then, when generating a compressed bitstream version of the input string (or block), the near-optimal encoding may be used to generate an encoded version of the values of the flags (or lengths or offsets) as the values are output into the bitstream. A header (or equivalently a trailer, or any other known or marked position) in the bitstream may be written to contain information about the encoding used so that the encoding may be reversed (e.g., by a decompressor or decoder) and the original values may be restored. The term header as used herein is intended to encompass other embodiments (e.g., trailer, etc.) that may write the information in other positions in the bitstream.

Both the lengths and the flags have a "self-amortizing" property in that if the values are large, then the encoding "covers" a larger span of the input (e.g., more of the characters of the input string), and the cost of encoding is of lesser concern. For example, an 11-bit encoding of a length covering 550 characters costs only 0.02 bits per character, far less expensive than a 2-bit encoding of a length covering just 3 characters. Hence, for the lengths and flags, some embodiments may truncate the histogram at some boundary (e.g., 16, 32, 48, etc.) and just encode anything larger than that in a less-efficient fashion—any loss in encoding efficiency in these embodiments is generally small. Offsets are not self-amortizing, because the offsets may be "all over the map." For example, a match may be found at any point in the input. A modification of the basic scheme detailed below may be used for offsets, and is also described below.

The post-processing technique works best (e.g., produces a smaller number of total bits in the output bitstream) when the counts in the histogram are monotonically decreasing (or nearly so), though alternatives used in some embodiments (described below) improve performance when this is not the case. The post-processing technique (optionally with the alternatives to improve performance) also works well on self-amortizing values (such as flags and lengths), since getting good answers for smaller values has a larger impact on the overall efficiency. The following description focuses on the flags first, and then describes special cases for the lengths and offsets.

The histogram post-processing generally operates iteratively from an initial position (e.g., the lowest valued bucket) in the histogram up through a first position that meets a "breakpoint" criteria. The set of positions (from initial through first) is then given an encoding using a minimal number of bits sufficient to distinguish all of the positions. The encoding also includes one option for "the rest" (e.g., the remaining positions after the first position). The process then repeats starting from the position after the first position, with the next encoding found being concatenated with the first encoding (e.g., using the option for "the rest" as the first encoding value). Thus, the initial through first positions are generally encoded in fewer bits than the subsequent positions.

Breakpoints are generally determined by the accumulated counts in the histogram buckets up through the position being considered being a specified fraction of the total (remaining) counts in the histogram. After encoding a set of positions, the total (remaining) counts are decremented by the sum of the counts in the removed buckets. After encoding the entire histogram, a table (or other data structure) may be written into a header in the bitstream providing the positions of the breakpoints and optionally and/or selectively other information. The information written into the header enables undoing the encoding, such as at a decompressor.

The breakpoints are generally determined by considering how the buckets being removed are encoded versus how "the rest" of the buckets are encoded. In the following example, "x . . . x" represents the encoding that will be used for "the rest." An example set of breakpoint rules may include:
 A) 0, 1x . . . x—pays off if the value encoded by 0 is greater than or equal to one-half of total remaining counts in the histogram;
 B) 00, 01, 1x . . . x—pays off if the values encoded by 00 and 01 are greater than or equal to one-half of total remaining counts in the histogram;
 C) 00, 01, 10, 11x . . . x—pays off if the values encoded by 00, 01, and 10 are greater than or equal to two-thirds of the total remaining counts in the histogram;
 D) 000, 001, 010, 011, and 1x . . . x—pays off if the values encoded by 000, 001, 010, and 011 are greater than or equal to one-half of total remaining counts in the histogram;
 E) 000, 001, 010, 011, 100, 101, and 11x . . . x—pays off if the values encoded by 000, 001, 010, 011, 100, and 101 are greater than or equal to two-thirds of the total remaining counts in the histogram and so forth.

A general rule is that for j prefix bits (of '1'), the values without the prefix should be greater than or equal to j/(j+1) of the total remaining counts in the histogram.

In general, many sets of rules are possible. In one example, the "greater than or equal to one-half" threshold may be implemented with some "fuzziness," allowing for some margin. In another example, when encoding, multiple choices may be tried to determine which choice is better. In some embodiments, spending greater time and/or resources in encoding is worthwhile, as decoding (e.g., decompressing) is more frequent.

As an example, consider the histogram of flags 150a in FIG. 6 with values 0, 1, 2, 3, 4, 5, and 6. The counts of flags with each of those values are 100, 20, 19, 18, 4, 5, and 3, respectively. The total number of flags is 169. A first breakpoint is at position 0, as 100 is greater than one-half of 169. Consequently, the flag with value 0 is encoded as '0', and all other flags are encoded as '1x . . . x'. Removing the counts for the first breakpoint produces the histogram 150b. In the histogram 150b, there are sixty-nine remaining flags in positions 1 through 6. Position 1 is not a breakpoint because twenty counts is less than one-half of sixty-nine. Position 2 is a second breakpoint since the sum of the counts in positions 1 and 2 (e.g., 20+19=39) is greater than one-half of the remaining total (e.g., 39>69/2). Since the second breakpoint encompasses positions 1 and 2, the flag with value 1 is encoded as '100', the flag with value 2 is encoded as '101', and all remaining flags are encoded as '11x . . . x'.

Referring to the histogram of flags 150c, after the counts for the second breakpoint are removed, there is a total of thirty remaining flags in positions 3 through 6. Position 3 is a third breakpoint since the count in position 3 (e.g., 18) is greater than one-half of the total remaining flags (e.g., 18>30/2). Since position 3 is the third breakpoint, the flag with value 3 is encoded as '110' and all remaining flags are encoded as '111x . . . x'. Referring to the histogram of flags 150d, after the counts for the third breakpoint are removed, there is a total of twelve remaining flags in positions 4 through 6. Position 4 is not a breakpoint (e.g., 4<12/2), but position 5 is a fourth breakpoint since the sum of the counts for positions 4 and 5 (e.g., 4+5=9) is greater than one-half of the remaining total (e.g., 9>12/2). Because position 5 is the fourth breakpoint, the flag with value 4 is encoded as '11100', the flag with value 5 is encoded as '11101', and the remaining flags are encoded as '1111x . . . x'. After the counts for the fourth breakpoint are removed (e.g., illustrated by the histogram of flags 150e in FIG. 6), there just one remaining bucket at position 6 and, therefore, the flag with value 6 is encoded as '1111'. Because the flag with value 6 is in the only remaining bucket, the flag with value 6 happens to get a smaller encoding than the flags with values 4 or 5. However, because none of the flags with values 4, 5, or 6 occurs with high frequency, the loss in encoding efficiency is small.

In some embodiments, when there are few buckets left, application of different breakpoint rules on the remaining buckets (e.g., breaking separately on each bucket) may yield better results. However, the cost of using any such modified rules includes encoding the fact that the modified rules were used in the output bitstream so that a decompressor is able to map the encoded values back to their original representations.

In some embodiments, while post-processing the histogram, a total length of the encoding of the values is maintained. For example, knowing that there are 100 counts in the first bucket that encode in 1 bit means that the first bucket will consume 100 bits in the output bitstream. Knowing that there are 39 counts in the next two buckets that each encode in 3 bits means that the next two buckets will consume 108 bits in the output bitstream. In further embodiments, determining a total number of bits used for all of the encoded values enables comparisons between the above encoding method and other alternatives.

Figure 7:
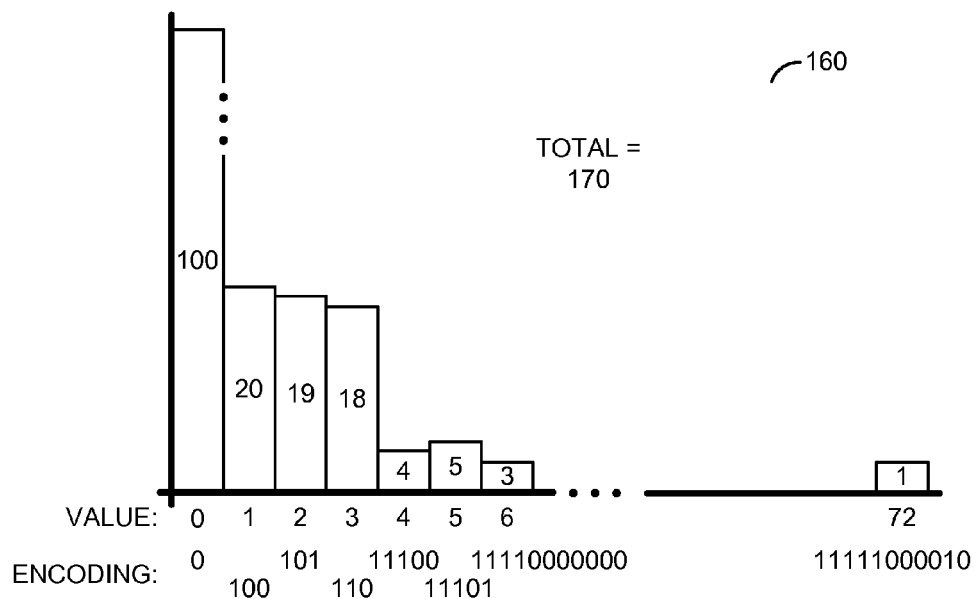
FIG. 7 is a diagram illustrating an example of a histogram having a large range.

Referring to FIG. 7, a diagram is shown illustrating a histogram 160 having a very large range. When a histogram has a very large range, any flags larger than a determined value may be encoded in a number of bits sufficient to represent the remaining range. The value may be determined up front (e.g., predetermined) or as part of the encoding process (e.g., on the fly). For example, the histogram 160 is similar to the histogram 150a in FIG. 6, except that there is also one flag with value 72. When the process described above in connection with FIG. 6 reaches the point where the flags with values 1-5 have been encoded, the remaining flags (e.g., position 6 and position 72) at the last step would take 7 bits (e.g., 72-6=66, and log base 2 of 66 rounds up to 7). The flag with value 6 could be encoded as '11110000000' (e.g., '1111' plus an offset of zero or '0000000') and the flag with value 72 could be encoded as '11111000010' (e.g., '1111' plus an offset of 66 or '1000010'). It is implicit in the encoding that the flags with values 0 to 5 are encoded prior to this point, and hence the offset of 0 corresponds to the next flag with value of 6 and the flag with value 72 is encoded as an offset of 66.

The breakpoints need to be output into the bitstream encoding so that flag values may be interpreted and decoded for decompression. For example, a header may be output at the start of the bitstream specifying the locations of the breakpoints (e.g., in a breakpoint table) and how many histogram buckets each covers. In some embodiments, the number of buckets covered implies the encoding used for those buckets. In the above example, the breakpoint table would indicate 4 breakpoints at positions 0, 2, 3, and 5. In some embodiments, the maximum length of the encoding, or equivalently the maximum flag value remaining to be encoded (or equivalently, the remaining value that needs to be encoded), also needs to be specified so that the maximum length of a flag encoding can be determined.

In some embodiments, the breakpoint positions imply the encoding used. In the above example, the first breakpoint at position 0 indicates only 1 value is covered by the first breakpoint, and thus the encoding is 0 and 1x . . . x. Similar, the second breakpoint at position 2, two after the first breakpoint, indicates that two values are covered and, thus, that the encodings of the two values are 100 and 101, with everything else being encoded as And so on. It will be apparent to those of ordinary skill in the art that the use of '0' and '1' may be reversed in the above description. For example, the encodings could use a leading 1 instead of a leading 0. Many encodings are contemplated within the scope of this invention.

As an example of the header, consider the histogram 160 of FIG. 7 (with the flag value of 72 included). Based upon a premise that the histogram 160 is processed only through flag value 15, that a maximum of six breakpoints are provided for, and that the maximum flag value is 4096, an example header encoding may be illustrated as follows:

3 bits to specify the number of breakpoints found (from 0 to 7 in this case);
  4 bits for each of the breakpoints to indicate the respective position—this field occurs a number of times specified by the previous field; and
  4 bits to specify the number of bits to encode "the rest"—any final values that are not in the histogram.

The above example would then encode as: 100 0000 0010 0011 0101 0111. There are 100=4 breakpoints at positions 0000, 0010, 0011, and 0101, and after position 5, 0111=7 bits are needed to encode the remaining values.

In various embodiments, if multiple sets of values are separately encoded (e.g., flags and/or lengths and/or offsets), a header specifies the encoding for each of the sets of values in a predetermined order. For example, the header may include a flag encoding section, followed by a length encoding section, followed by an offset encoding section. However, other arrangements may be implemented accordingly to meet the design criteria of a particular implementation.

In some embodiments, the histogram may not be close enough to monotonic, and a permutation of the first few columns would render the histogram more closely monotonic. The simplest example of this is swapping the positions of buckets 0 and 1 whenever the count in bucket 1 is more than one-half the total (so that once swapped, these values would be encoded in just 1 bit). Of course, one bit in the header would need to be dedicated for specifying whether such a swap was done or not, so that the swap could be reversed on decoding. The above swap technique could be extended to have a more general permutation of one or more positions in the histogram, and a code specifying the permutation that is added to the header.

In some embodiments, spike removal is also performed. One or more positions in the histogram may be a spike value (e.g., a count that is so large that encoding the corresponding position separately will reduce a total size of all of the encoded bits). For example, the flag encoding without spike removal and how many bits are needed for the flag encoding of the spike value may be evaluated and the costs of encoding the spike value as is (e.g., the count for the spike value times the encoded length for the position of the spike value) versus the cost of encoding the spike value in 1 bit and making all other compared encodings 1 bit larger. If encoding a value as a spike is worthwhile (e.g., fewer bits are used), the spike is generally encoded as '0', and all other values encoded as '1x . . . x' using the post-processing technique described above to determine 'x . . . x'.

If spike encoding is used, then the header in the bitstream output needs to include an indication that spike encoding was done, and the value of the spike. For example, the first bit in the encoding for a set of numbers may indicate whether spike encoding is used, and if that bit indicates spike encoding was used, a fixed number of following bits may indicate the value of the spike. Of course, since spike encoding is an option, the maximum value can be limited, and spikes beyond the maximum that may be encoded in the header may be ignored. Alternatively or in addition, there could be a minimum spike value (e.g., a spike in position 0 is meaningless with flags) and the encoded spike value could be an offset from the known minimum value. Further, in some embodiments, the removal and encoding of more than one spike may be enabled. For example, the spike indication in the header could be generalized from a single bit to a count of the number of spikes that are removed.

In some embodiments, heuristics may be used to determine if spike removal should be done so that the remaining histogram buckets may be encoded with the spike removed. For example, a first spike value in the bucket at position x may be presumed to need at least the ceiling of the log base 2 of x+2 bits to encode without spike removal (the '+2' is used to account for the 0-based numbering, and one more for "the rest" which needs to be encoded after the spike). Similarly, a second spike value at position y may be presumed to need at least one more than the ceiling of the log base 2 of y+2 bits to encode without spike removal.

In some embodiments, if spike encoding is used, the spike value is removed from the histogram (and the total count of values in the histogram) prior to doing the iterative processing to encode the other positions, so as to not distort encodings of the other positions. In further embodiments, values after the spike value may be treated as one less so as not to have an encoding for the (separately handled) spike value. For example, in the post-processing encoding, values greater than or equal to the spike value may be offset by −1 to remove the hole caused by optimizing the spike value.

Figure 8:
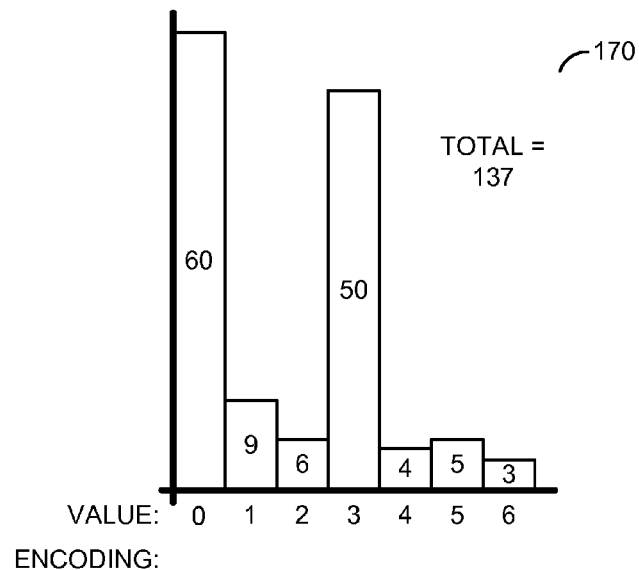
FIG. 8 is a diagram illustrating an example of a histogram including a spike.

Referring to FIG. 8, a diagram is shown illustrating a histogram of flags 170 with counts 60, 9, 6, 50, 4, 5, and 3 (e.g., a total of 137 counts). Position 3 having the value 50 is a spike, even though position 3 has a lower count than position 0. This is because it will take at least 3 bits to encode position 3, and thus at least 150 bits total for all 50 occurrences of that value. If spike encoding is used, those 50 positions will be encoded in just 1 bit, saving 100 bits, but the other 87 counts will need 1 bit more. Thus, using spike encoding in this case saves 100-87=13 bits, ignoring the cost of including the spike value encoding in the header. In some embodiments, the header encoding cost is also considered when determining whether or not encoding a spike reduces a total length of an output bitstream.

The lengths work much like the flags, but generally have a non-zero minimum, such as 3—in some embodiments, it is not worth generating a copy instruction unless at least three characters are matched. In the case of lengths, the first bucket in the histogram represents the minimum allowed length value, not necessarily the value 0.

Unlike flags and lengths, offsets are much more varied. Further, whereas for flags and lengths the histogram can be easily bounded in maximum size (number of buckets) without sacrificing significant efficiency (due to the self-amortizing property), the same is not true of offsets. To encode offsets, a self-scaling version of the histogram processing may be used. Instead of one large histogram covering all offsets, some embodiments use n smaller histograms, where different ranges of offset values are combined in one bucket. For example, a first histogram has aggregated buckets with a range of four (e.g., offsets 0-3, 4-7, 8-11, etc.), a second histogram has aggregated buckets with a range of eight (e.g., offsets 0-7, 8-15, 16-23, etc.), and so on. The histogram producing the best encoding is then selected, and the post-processing technique is performed on the selected histogram. The post-processing technique has then encoded the aggregated buckets—to encode a given value, the LSBs that distinguish the value within the bucket are appended to the encoding for the aggregated bucket. For example, if the first aggregated bucket had values 0-3 and is encoded as '00', then the values output for 0, 1, 2, and 3 would be '0000', '0001', 0010', and '0011'. Similarly, all the bucket encodings in this example would have two additional bits appended to provide the LSBs of the value. If there are values "off the end" of the selected histogram (as for the values 6 and 72 in the example above), they can be encoded directly as their value (or delta from the last encoded position).

One way to select the best histogram is to find the first histogram (beginning with the ones with the smallest aggregated ranges) that has a "good enough" compression. One such metric is that the first bucket in the histogram encodes one-half of the total number of values. This selects a range that is known a priori to produce a relatively efficient encoding, possibly at a cost in requiring more LSBs to be explicitly provided for a wider range). Other metrics, such as the first two buckets encoding one-half of the total number of values, the first n buckets encoding one-half of the total number of values, minimizing the estimated number of bits needed to encode the first n buckets, etc., are also contemplated. It is also possible, at a cost in more time and/or hardware, to try all ranges, or to try ranges bordering a selected range, (e.g., doing full post-processing on each) to determine which produces an encoding using the fewest total bits.

In some alternative embodiments, a single large histogram with buckets of range 1 may be used, too, and different numbers of sequential buckets may be treated as one aggregated bucket. This approach allows the range of the first aggregated bucket to vary (and be different from the ranges of the other aggregated buckets). Of course, any information such as varying or different ranges used to encode needs to be placed into the header so that decoding is able to reverse the process.

It is beneficial with offsets to do spike removal prior to selecting a desired range, as the presence of the spike(s) may distort the selection. Similarly, other optimizations, such as permuting the first two or more bucket positions to make the histogram closer to monotonic, could, in some embodiments, also be performed prior to selecting a desired range.

For offsets, the header needs to include an indication of which histogram was used (e.g., how many LSBs are to be expected after the normal encodings). It would be apparent to those of ordinary skill in the art that the techniques used here may be applicable to providing near-optimal encodings for other types of data, not just flags, lengths, and offsets. In some embodiments, flag encoding is evaluated with a number of different techniques, and the best (least bits to encode all flags) is used. A field in the header indicates the type of flag encoding that is used, and in the case of the unused character encoding, the special character value. Some options for flag encoding may include, but are not limited to:

One bit per symbol, such as '0' preceding a character, and '1' preceding a copy instruction.

Character count flags, encoded as described above. In this case, a flag value (the character count) precedes the number of characters, followed by one copy instruction. The number of bits needed is determined during the post-processing of the flag value histogram, as described above.

An "unused character" encoding—if less than all of the different possible character values appeared in the input string, an unused character (preferably with a shortest encoded representation among all unused characters) is used to "flag" (precede) copy instructions. The unused character encoding utilizes n bits per copy instructions, where n is the number of bits needed to encode the selected unused character.

Comparing the sizes of the various flag encodings is possible since after the creation of the self-referencing dictionary and the post-processing of the statistics, as described above, the number of bits needed by each of the flag encodings is known. In some embodiments, such comparisons also include a size of the header information needed to encode the type of encoding selected. For example, the unused character flag encoding uses more header bits than the other approaches.

Figure 9:
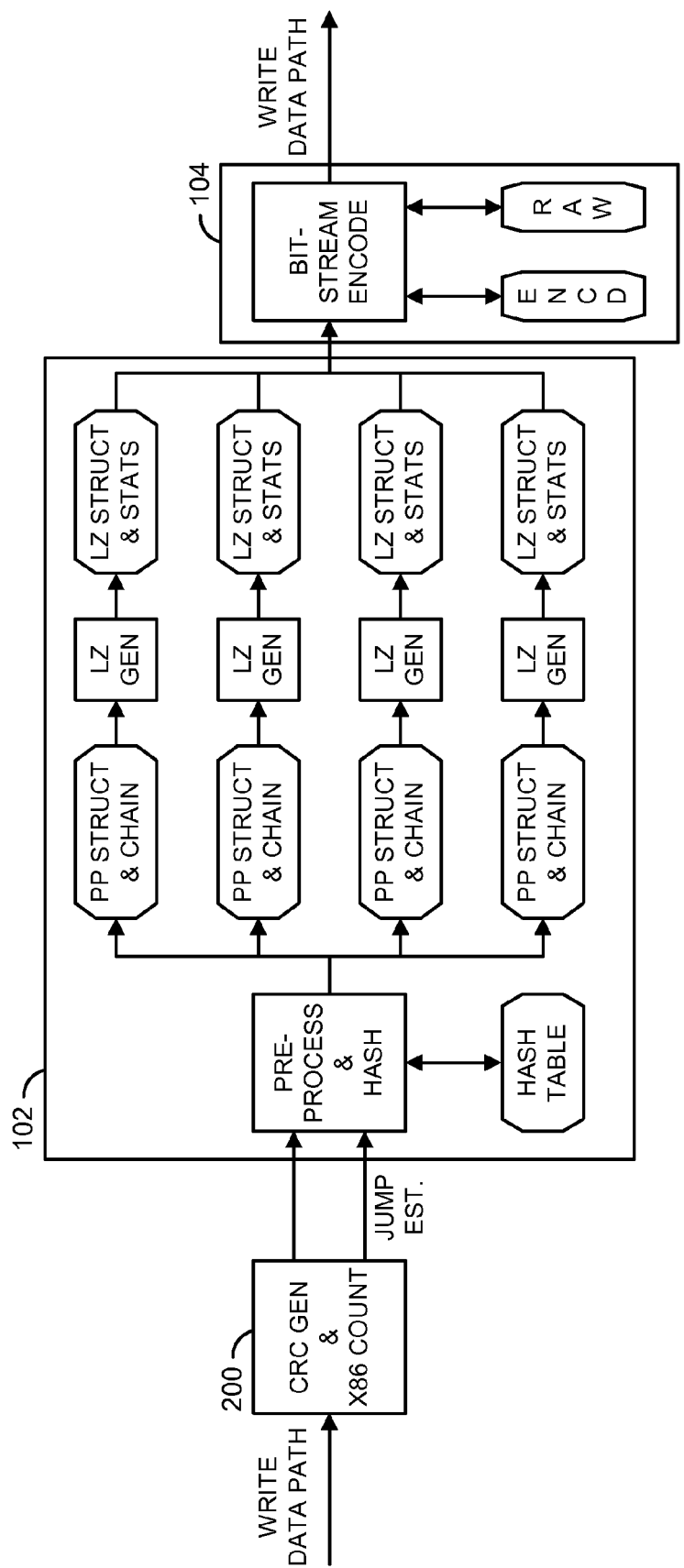
FIG. 9 is a diagram illustrating an example compression system implementing a compression unit in accordance with an embodiment of the present invention and including CRC generation and jump handling.

Referring to FIG. 9, a diagram is shown illustrating a compression unit in accordance with an embodiment of the present invention implemented in a system including CRC generation and jump handling and bitstream generation. Prior to the pre-processing operation described above, input data may be process by a CRC generation and jump counting module 200. CRC generation is performed over each host page (appending the CRC bytes at the end). For the first ~256 bytes of each input frame, a count of x86 jump instructions is performed to estimate if x86 jump filtering should be performed. This is a short store-and-forward since this info is needed at the start of pre-processing.

Figure 10:
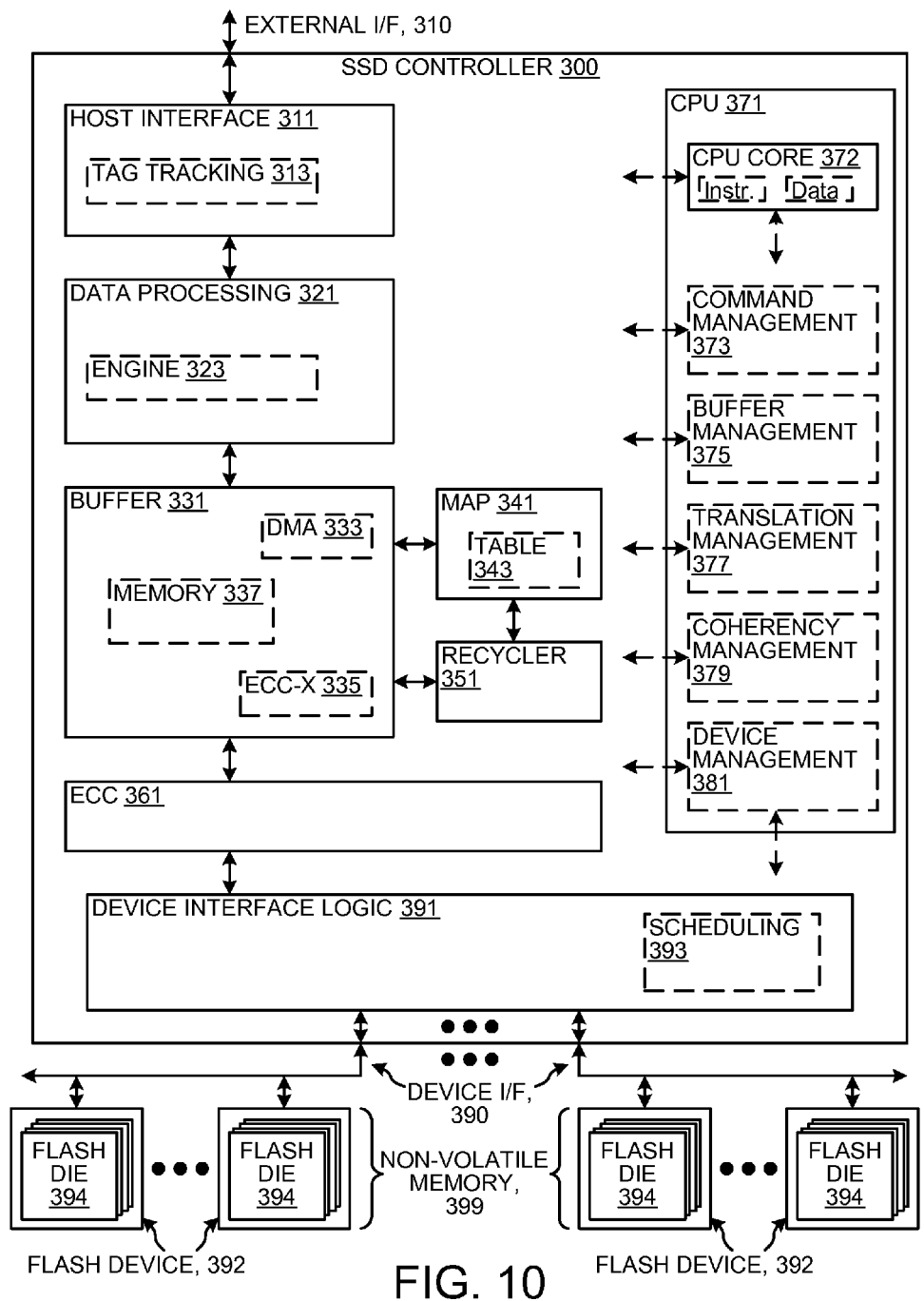
FIG. 10 is a diagram illustrating a solid-state disk (SSD) including an SSD controller in which bitstream encoding techniques in accordance with an embodiment of the present invention may be implemented to compress data prior to storage into non-volatile (e.g., Flash) memory.

Referring to FIG. 10, a diagram is shown illustrating a solid-state disk (SSD) including an SSD controller 300 in which bitstream encoding techniques in accordance with an embodiment of the present invention may be implemented to compress data prior to storage into non-volatile (e.g., Flash) memory. The SSD controller 300 may be coupled via one or more external interfaces 310 to a host (not shown). According to various embodiments, external interfaces 310 are one or more of: a SATA interface; a SAS interface; a PCIe interface; a Fibre Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, the SSD controller 300 includes a SATA interface and a PCIe interface.

The SSD controller 300 is further coupled via one or more device interfaces 390 to non-volatile memory 399 including one or more storage devices, such as flash devices 392. According to various embodiments, device interfaces 390 are one or more of: an asynchronous interface; a synchronous interface; a DDR synchronous interface; an ONFI compatible interface, such as an ONFI 2.2 compatible interface; a Toggle-mode compatible flash interface; a non-standard version of any of the preceding interfaces; a custom interface; or any other type of interface used to connect to storage devices.

The Flash devices 392 have, in some embodiments, one or more individual flash die 394. According to a type of a particular one of the flash devices 392, a plurality of flash die 394 in the particular flash device 392 are optionally and/or selectively accessible in parallel. The Flash devices 392 are generally representative of one type of storage device enabled to communicatively couple to SSD controller 300. However, in various embodiments, any type of storage device is usable, such as an SLC NAND flash memory, MLC NAND flash memory, NOR flash memory, read-only memory, static random access memory, dynamic random access memory, ferromagnetic memory, phase-change memory, racetrack memory, or any other type of memory device or storage medium.

According to various embodiments, the device interfaces 390 are organized as: one or more busses with one or more flash devices 392 per bus; one or more groups of busses with one or more flash devices 392 per bus, where busses in a group are generally accessed in parallel; or any other organization of flash devices 392 coupled to device interfaces 390.

The SSD controller 300 may have one or more modules, such as a host interface module 311, a data processing module 321, a buffer 331, a map 341, a recycler 351, an error-correcting code (ECC) module 361, a central processing unit (CPU) 371, and device interface logic 391. The specific modules and interconnections illustrated in FIG. 10 are merely representative of one embodiment, and many arrangements and interconnections of some or all of the modules, as well as additional modules not illustrated, may be implemented to meet the design criteria of a particular implementation. In a first example, in some embodiments, there are two or more host interfaces 311 to provide dual-porting. In a second example, in some embodiments, the data processing module 321 and/or the ECC module 361 are combined with the buffer 331. In a third example, in some embodiments, the host interfaces 311 are directly coupled to the buffer 331, and the data processing module 321 optionally and/or selectively operates on data stored in the buffer 331. In a fourth example, in some embodiments, the device interface logic 391 is directly coupled to the buffer 331, and the ECC module 361 optionally and/or selectively operates on data stored in the buffer 331.

The host interface 311 sends and receives commands and/or data via the external interface 310, and, in some embodiments, tracks progress of individual commands via the tag tracking module 313. For example, the commands include a read command specifying an address (such as an LBA) and an amount of data (such as a number of LBA quanta, e.g. sectors) to read; in response the SSD provides read status and/or read data. For another example, the commands include a write command specifying an address (such as an LBA) and an amount of data (such as a number of LBA quanta, e.g. sectors) to write; in response the SSD provides write status and/or requests write data and optionally subsequently provides write status. In some embodiments, the host interface 311 is compatible with a SATA protocol and, using NCQ commands, is enabled to have up to 32 pending commands, each with a unique tag represented as a number from 0 to 31. In some embodiments, the tag tracking module 313 is enabled to associate an external tag for a command received via the external interface 310 with an internal tag used to track the command during processing by SSD controller 300.

According to various embodiments, one or more of: data processing module 321 optionally and/or selectively processes some or all data sent between the buffer 331 and the external interfaces 310; and data processing module 321 optionally and/or selectively processes data stored in the buffer 331. In some embodiments, the data processing module 321 uses one or more engines 323 to perform one or more of: encrypting; decrypting; compressing; decompressing; formatting; reformatting; transcoding; and any other data processing and/or manipulation task. For example, according to various embodiments, the data processing module 321 includes a compression unit (e.g., the circuit 100 described above in connection with FIGS. 1 and 2) implementing an encoding scheme in accordance with various embodiments of the present invention.

The buffer 331 stores data sent to/from the external interfaces 310 from/to the device interfaces 390. In some embodiments, the buffer 331 additionally stores system data, such as some or all map tables, used by the SSD controller 300 to manage the flash devices 392. In various embodiments, the buffer 331 has one or more of: a memory 337 used for temporary storage of data; a direct memory access (DMA) modules 333 used to control movement of data to and/or from the buffer 331; an ECC-X module 335 used to provide a higher-level error correction function; and other data movement and/or manipulation functions. An example of a higher-level error correction function is a RAID-like capability, where redundancy is at a flash device (e.g. multiple ones of the flash devices 392) level and/or a flash die (e.g. flash die 394) level instead of at a disk level.

According to various embodiments, one or more of: the ECC module 361 optionally and/or selectively processes some or all data sent between the buffer 331 and the device interfaces 390; and the ECC module 361 optionally and/or selectively processes data stored in the buffer 331. In some embodiments, the ECC module 361 implements one or more of: a CRC code; a Hamming code; an RS code; a BCH code; an LDPC code; a Viterbi code; a trellis code; a hard-decision code; a soft-decision code; an erasure-based code; any error detecting and/or correcting code; and any combination of the preceding.

The device interface logic 391 controls the flash devices 392 via the device interfaces 390. The device interface logic 391 is enabled to send data to/from the flash devices 392 according to a protocol of the flash devices 392. The device interface logic 391 includes a scheduling module 393 to selectively sequence control of the flash devices 392 via the device interfaces 390. For example, in some embodiments, the scheduling module 393 is enabled to queue operations to the flash devices 392, and to selectively send the operations to individual ones of the flash devices 392 (or the flash die 394) as individual flash devices 392 (or flash die 394) are available.

The map 341 converts between data addressing used on the external interfaces 310 and data addressing used on the device interfaces 390, using table 343 to map external data addresses to locations in the non-volatile memory 399. For example, in some embodiments, the map 341 converts logical block addresses (LBAs) used on the external interfaces 310 to block and/or page addresses targeting one or more flash die 394, via mapping provided by table 343. In some embodiments, a granularity of map 341 is fixed, such as mapping first fixed-sized logical blocks used on the external interfaces 310 to second fixed-sized blocks used on the device interfaces 390. In other embodiments, a granularity of map 341 is variable and not all blocks used on either the external interfaces 310 or the device interfaces 390 are necessarily a same size.

In some embodiments, table 343 associates logical page addresses with a respective map entry, where the logical page addresses are a portion of and/or are derived from the LBA, and the map entry identifies a portion of the non-volatile memory. For example, in some embodiments, the logical page address is a higher-order portion of the LBA, and a lower-order portion of the LBA is an offset within a logical page specified by the logical page address.

In some embodiments, the map entry identifies the portion of the non-volatile memory as a base address, such as a read unit address, and a length, such as a number of read units. In some embodiments, the read units are sequential in locations in an address space of the non-volatile memory. In further embodiments, the read units are striped across a plurality of flash die (such as flash die 394) and/or flash devices (such as flash devices 392).

In some embodiments, map 341 uses table 343 to perform and/or to look up translations between addresses used on the external interfaces 310 and data addressing used on the device interfaces 390. According to various embodiments, table 343 is one or more of: a one-level map; a two-level map; a multi-level map; a map cache; a compressed map; any type of mapping from one address space to another; and any combination of the foregoing. According to various embodiments, table 343 includes one or more of: static random access memory (SRAM); dynamic random access memory (DRAM); non-volatile memory (such as flash memory); cache memory; on-chip memory; off-chip memory; and any combination of the foregoing.

In some embodiments, the recycler module 351 performs garbage collection. For example, in some embodiments, flash devices 392 contain blocks that must be erased before the blocks are re-writeable. The recycler module 351 is enabled to determine which portions of the flash devices 392 are actively in use, such as by scanning a map maintained by map 341, and to make unused portions of flash devices 392 available for writing by erasing them. In further embodiments, the recycler module 351 is enabled to move data stored within the flash devices 392 to make larger contiguous portions of the flash devices 392 available for writing.

The CPU 371 controls various portions of SSD controller 300. The CPU 371 includes a CPU core 372. The CPU core 372 is, according to various embodiments, one or more single-core or multi-core processors. The individual processor cores in the CPU core 372 are, in some embodiments, multi-threaded. The CPU core 372 includes instruction and/or data caches and/or memories. For example, the instruction memory contains instructions to enable the CPU core 372 to execute software (sometimes called firmware) to control the SSD controller 300. In some embodiments, some or all of the firmware executed by the CPU core 372 is stored on the flash devices 392.

In various embodiments, the CPU 371 further includes: a command management module 373 to track and control commands received via the external interfaces 310 while the commands are in progress; a buffer management module 375 to control allocation and use of the buffer 331; a translation management module 377 to control the map 341; a coherency management module 379 to control consistency of data addressing and to avoid conflicts such as between external data accesses and recycle data accesses; a device management module 381 to control device interface logic 391; and optionally other management units. None, any, or all of the management functions performed by the CPU 371 are, according to various embodiments, controlled and/or managed by hardware, by software (such as software executing on the CPU core 372 or on a host connected via the external interfaces 310), or any combination thereof.

In some embodiments, the CPU 371 is enabled to perform other management tasks, such as one or more of: gathering and/or reporting performance statistics; implementing SMART; controlling power sequencing, controlling and/or monitoring and/or adjusting power consumption; responding to power failures; controlling and/or monitoring and/or adjusting clock rates; and other management tasks.

Various embodiments include a computing-host flash memory controller that is similar to the SSD controller 300 and is compatible with operation with various computing hosts, such as via adaptation of the host interface 311 and/or the external interface 310. The various computing hosts include one or any combination of a computer, a workstation computer, a server computer, a storage server, a PC, a laptop computer, a notebook computer, a netbook computer, a PDA, a media player, a media recorder, a digital camera, a cellular handset, a cordless telephone handset, and an electronic game.

In various embodiments, all or any portion of an SSD controller 300 (or a computing-host flash memory controller) are implemented on a single integrated circuit (IC), a single die of a multi-die IC, a plurality of dice of a multi-die IC, or a plurality of ICs. For example, the buffer 331 is implemented on a same die as other elements of the SSD controller 300. For another example, the buffer 331 is implemented on a different die than other elements of SSD controller 300.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The functions represented by the diagrams of FIGS. 1-10 may, in some embodiments, be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

Embodiments of the present invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a first circuit configured to generate (i) a compressed representation of an input sequence of characters and (ii) statistics regarding one or more types of information in the compressed representation of the input sequence of characters, wherein the statistics comprise a histogram representation of values of a particular type of said one or more types of information; and
a second circuit configured to generate a compressed bitstream representation of the input sequence of characters in response to the compressed representation of the input sequence of characters and one or more of the statistics regarding the one or more types of information in the compressed representation of the input sequence of characters, wherein bitstream values encoding the one or more types of information are determined based upon a frequency of occurrence of the one or more types of information in the compressed representation of the input sequence of characters and using the histogram representation.

2. The apparatus according to claim 1, wherein said first circuit is configured to perform Lempel-Ziv (LZ) compression on said input sequence of characters.

3. The apparatus according to claim 1, wherein said first circuit is configured to perform a modified Lempel-Ziv (LZ) compression that generates said compressed representation of said input sequence of characters based upon a reduced representation of said input sequence of characters containing one or more codes representing repetitions of a sequence of one or more characters.

4. The apparatus according to claim 1, wherein the one or more types of information comprises a copy instruction length information.

5. The apparatus according to claim 1, wherein the one or more types of information comprises one or more of a length value, an offset value, and a flag value.

6. The apparatus according to claim 1, wherein the compressed bitstream is a loss-less representation of the input sequence of characters.

7. The apparatus according to claim 1, wherein said first circuit and said second circuit are part of a compression unit.

8. The apparatus according to claim 1, wherein said first circuit comprises one or more compression engines.

9. The apparatus according to claim 1, wherein said first circuit comprises a plurality of compression engines arranged in parallel.

10. The apparatus according to claim 1, wherein said second circuit is configured to find a first position in the histogram representation where an accumulated sum of the values of the particular type of information up through the first position is greater than or equal to one-half of a total of the values of the particular type of information.

11. The apparatus according to claim 10, wherein determining the bitstream values encoding the one or more types of information comprises encoding the positions in the histogram representation up through the first position in a minimal number of bits sufficient to distinguish each of the positions in the histogram representation up through the first position and at least one additional alternative.

12. The apparatus according to claim 11, wherein determining the bitstream values encoding the one or more types of information further comprises finding a second position in the histogram representation subsequent to the first position where the accumulated sum of the values of the type of information after the first position and up through the second position is greater than or equal to one-half of the total of the remaining values of the type of information after subtracting the values of the type of information up through the first position.

13. The apparatus according to claim 12, wherein determining the bitstream values encoding the one or more types of information further comprises encoding the positions in the histogram after the first position and up through the second position as a concatenation of the encoding of the at least one additional alternative and a minimal number of bits sufficient to distinguish each of the positions in the histogram representation after the first position and up through the second position and at least one still further alternative.

14. An apparatus comprising:
means for generating (i) a compressed representation of an input sequence of characters and (ii) statistics regarding one or more types of information in the compressed representation of the input sequence of characters, wherein the statistics comprise a histogram representation of values of a particular type of said one or more types of information; and
means for generating a compressed bitstream representation of the input sequence of characters in response to the compressed representation of the input sequence of characters and one or more of the statistics regarding the one or more types of information in the compressed representation of the input sequence of characters, wherein bitstream values encoding the one or more types of information are determined based upon a frequency of occurrence of the one or more types of information in the compressed representation of the input sequence of characters and using the histogram representation.

15. A method of optimizing bitstream encoding for compression comprising:

generating (i) a compressed representation of an input sequence of characters and (ii) statistics regarding one or more types of information in the compressed representation of the input sequence of characters, wherein the statistics comprise a histogram representation of values of a particular type of said one or more types of information; and generating a compressed bitstream representation of the input sequence of characters in response to the compressed representation of the input sequence of characters and one or more of the statistics regarding the one or more types of information in the compressed representation of the input sequence of characters, wherein bitstream values encoding the one or more types of information are determined based upon a frequency of occurrence of the one or more types of information in the compressed representation of the input sequence of characters and using the histogram representation.

* * * * *